US007894609B2

(12) United States Patent
Heinsen

(10) Patent No.: US 7,894,609 B2
(45) Date of Patent: Feb. 22, 2011

(54) STEREO SIGNAL PROCESSING APPARATUS

(75) Inventor: Björn Heinsen, Buxtehude (DE)

(73) Assignee: Trident Microsystems (Far East) Ltd., Grand Cayman (KY)

( * ) Notice: Subject to any disclaimer, the term of this patent is extended or adjusted under 35 U.S.C. 154(b) by 1638 days.

(21) Appl. No.: 10/520,316

(22) PCT Filed: Jul. 1, 2003

(86) PCT No.: PCT/IB03/03047

§ 371 (c)(1),
(2), (4) Date: Jan. 5, 2005

(87) PCT Pub. No.: WO2004/008633

PCT Pub. Date: Jan. 22, 2004

(65) Prior Publication Data

US 2005/0254659 A1 Nov. 17, 2005

(30) Foreign Application Priority Data

Jul. 10, 2002 (EP) ................................. 02015376

(51) Int. Cl.

| | |
|---|---|
| ***H04H 20/47*** | (2008.01) |
| ***H04H 40/72*** | (2008.01) |
| ***H04H 20/49*** | (2008.01) |
| ***H04R 5/00*** | (2006.01) |
| ***H03B 29/00*** | (2006.01) |
| ***G06F 17/00*** | (2006.01) |

(52) U.S. Cl. .................. 381/2; 381/1; 381/15; 381/16; 381/13; 381/71.11; 700/94

(58) Field of Classification Search ..................... 381/2, 381/13, 97, 106, 71.11, 15, 16, 1; 700/94
See application file for complete search history.

(56) References Cited

U.S. PATENT DOCUMENTS

| | | | | |
|---|---|---|---|---|
| 3,778,602 A | * | 12/1973 | Schmitt | 701/218 |
| 3,931,482 A | | 1/1976 | Sugimoto et al. | |
| 4,533,951 A | * | 8/1985 | Powers | 348/428.1 |
| 4,533,960 A | * | 8/1985 | Tiemann et al. | 386/41 |
| 4,654,707 A | | 3/1987 | Mycynek | |

(Continued)

FOREIGN PATENT DOCUMENTS

| | | |
|---|---|---|
| EP | 0584718 | 3/1994 |
| EP | 1083656 | 3/2001 |
| JP | 29-6861974 | 8/1974 |
| JP | 49-134302 | 12/1974 |

(Continued)

OTHER PUBLICATIONS

Horl M et al. "BTSC Stereo Decoder/Audio Processor With Automatic Alignments", Digest of Technical Papers of the International Conference on Consumerelectronics (ICCE). Rosemont, (1994), New York, IEEE, US, pp. 238-239, Hamburg, Germany XP000504034 ISBN: 0-7803-1454-9.

*Primary Examiner*—Vivian Chin
*Assistant Examiner*—George C Monikang
(74) *Attorney, Agent, or Firm*—DLA Piper LLP (US)

(57) ABSTRACT

Disclosed is a stereo signal processing apparatus, in particular for a digital BTSC television decoder, comprising a sub-channel signal processing section which comprises an input for inputting an input sub-channel signal, a DBX expanding means and an output for outputting an output sub-channel signal. The particularity of the present invention is that said sub-channel signal processing section further comprises a phase error compensating means for correcting a phase error of said DBX expanding means so that at said output of said sub-channel signal processing section the phase of the output sub-channel signal is essentially constant or zero over a predetermined frequency range.

2 Claims, 2 Drawing Sheets

U.S. PATENT DOCUMENTS

Figure 1:
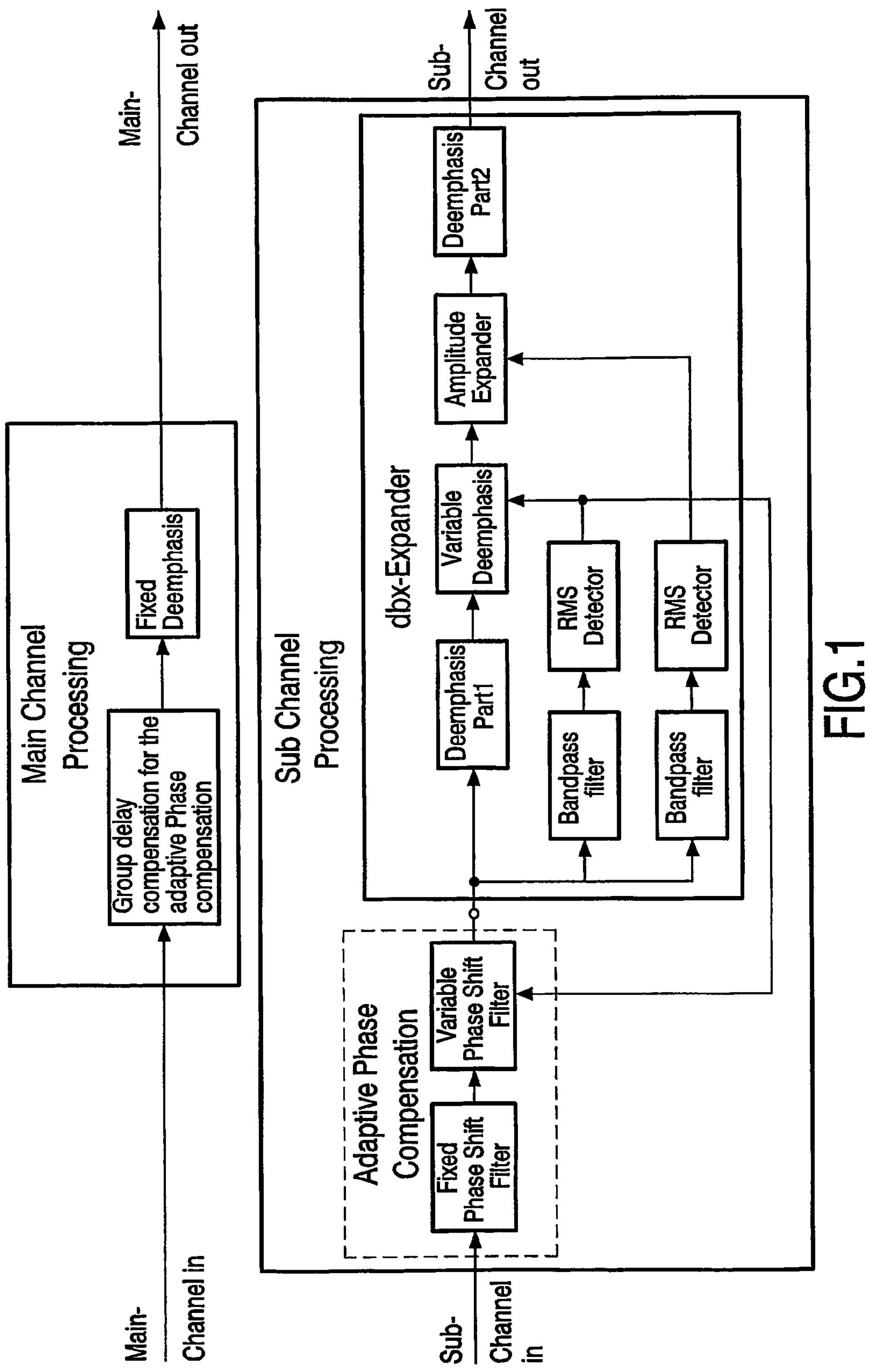

| | | | | | |
|---|---|---|---|---|---|
| 4,910,778 | A | * | 3/1990 | Barton | 381/1 |
| 5,091,957 | A | * | 2/1992 | Anderson et al. | 381/106 |
| 5,224,170 | A | * | 6/1993 | Waite, Jr. | 381/92 |
| 5,241,687 | A | * | 8/1993 | Short | 455/45 |
| 5,331,583 | A | * | 7/1994 | Hara et al. | 708/300 |
| 5,373,562 | A | | 12/1994 | Albean | 381/13 |
| 5,377,272 | A | | 12/1994 | Albean | |
| 6,037,993 | A | | 3/2000 | Easley | |
| 2005/0257598 | A1 | * | 11/2005 | Alcoverro et al. | 73/1.57 |
| 2007/0016316 | A1 | * | 1/2007 | Hanna | 700/94 |

FOREIGN PATENT DOCUMENTS

| | | | |
|---|---|---|---|
| JP | 64-089900 | | 5/1989 |
| JP | 6216805 | | 8/1994 |
| JP | 07-311585 | | 11/1995 |
| JP | 2004-521541 | | 7/2004 |
| KR | 920009727 | | 10/1992 |
| WO | 02065815 | A2 | 8/2002 |

* cited by examiner

STEREO SIGNAL PROCESSING APPARATUS

The present invention relates to a stereo signal processing apparatus, in particular for a digital BTSC television decoder, comprising a sub-channel signal processing section which comprises an input for inputting an input sub-channel signal, a DBX expanding means and an output for outputting an output sub-channel signal.

Such an apparatus provides a channel separation during stereo transmission of audio signals so as to reconstruct the original L (left) and R (right) audio signals wherein the sub-channel signal is the stereo audio difference signal (L−R) which is processed in addition to a main channel signal which is the sum stereo audio signal (L+R).

Such a stereo signal processing apparatus is particularly used in BTSC decoders for television, video tape recorders and other multimedia devices operating under the BTSC television standard. The DBX expanding means is provided for decoding the sub-channel signal which is encoded in accordance with the BTSC multichannel sound system standard including DBX companding.

U.S. Pat. No. 5,373,562 A discloses a signal processor for stereo signals wherein an expander circuit is provided for decoding audio signals which were encoded in accordance with the BTSC multichannel sound system standard including DBX companding. A wideband expander circuit is utilized and a DBX expander can be accommodated. The wideband expander circuit is provided with a signal path having an input low pass filter, a stereo difference signal (L−R) demodulator, a second low pass filter, and a voltage controlled amplifier, the gain of which is controlled by a control signal derived from the demodulated difference signal which has been operated on by a bandpass filter and an integrating peak detector. The output of the voltage controlled amplifier is provided to a de-emphasis network before being fed to a decoder matrix for combining with the sum stereo signal (L+R) for reconstructing the original L and R signals. When a DBX expander is connected, the DBX expander is substituted in place of the de-emphasis network, the voltage controlled amplifier control signal, which provides the wideband expansion, is overridden by a predetermined voltage, the bandpass filtering characteristic of the bandpass filter is disabled, and the input is switched to bypass the input low pass filter. The disablement of the bandpass filter filtering characteristics actuates the switching of the input to bypass the input low pass filter.

Similar circuits are described in EP 0 584 718 A2 and EP 1 083 656 A2.

However, it has been observed that in the conventional stereo signal processing apparatus the channel separation becomes poor for higher audio frequencies.

It is an object of the present invention to avoid the above mentioned drawback of the prior art and to provide a stereo signal processing apparatus with an improved construction so that the channel separation is satisfying not only for lower frequencies, but also for higher frequencies.

In order to achieve this and further objects, according to the present invention, there is provided a stereo signal processing apparatus, in particular for a digital BTSC television decoder, comprising a sub-channel signal processing section which comprises an input for inputting an input sub-channel signal, a DBX expanding means and an output for outputting an output sub-channel signal, characterized in that said sub-channel signal processing section further comprises a phase error compensating means for correcting a phase error of said DBX expanding means so that at said output of said sub-channel signal processing section the phase of the output sub-channel signal is essentially constant or zero over a predetermined frequency range.

Namely, it has been found that the poor channel separation in particular at higher audio frequencies results from a phase error which occurs in the DBX expanding means and increases up to about half of the scanning frequency (0.5×Fs). In order to reduce or eliminate such phase error, according to the present invention, the sub-channel signal processing section is provided with a phase error compensating means which results in that the phase is corrected so as to be essentially constant or zero over the interesting frequency range which usually is the audio frequency range. Consequently, by the invention the channel separation during stereo transmission, and, thus, the sound quality can be improved not only for lower, but also for higher audio frequencies.

In particular, the present invention is very useful for a digital implementation of the stereo signal processing apparatus and in particular of the sub-channel signal processing section in BTSC decoder.

Further advantageous embodiments of the invention are defined in the dependent claims.

Preferably, said phase error compensating means is coupled between said input of said sub-channel signal processing section and said DBX expanding means.

In particular, it has been found that the DBX expanding means exhibits a phase deviation which is essentially linear over the frequency range and is depending on the amplitude of the input signal. So, to overcome this, said phase error compensating means comprises a linear level depending phase error correction means. To implement the level dependency, said linear level depending phase error correction means should be controlled in accordance with the amplitude of the sub-channel signal. This results in a very good phase error compensation. In case said DBX expanding means comprises a spectral expander having a control signal output for outputting a control signal, in particular a root main square (RMS) control signal, said linear level depending phase error correction means should be controlled by said control signal.

In a still further preferred embodiment, said linear level depending phase error correction means comprises a variable phase delay (VPD) filter, preferably with an extended mixer functionality. Namely, it has been found that such a filter has a phase response which can be essentially linear up to 0.5×Fs. Preferably, the control input of such VPD filter is connected to the control signal output of the DBX expanding means.

As mentioned above, the provision of a VPD filter results in a very good phase error compensation, but therefore a VPD filter with a very high order is needed. However, with an economic VPD filter it is possible to compensate the phase error up to about FS/4, wherein afterwards the phase response of such a VPD filter is losing linearity and turns smoothly to zero. If the provision of such an economic VPD filter is wanted without increasing the filter order, it is suggested to additionally provide a fixed phase shift filter for formatting the phase error in a way that it fits mostly to the phase response of such a VPD filter. Such an additional fixed phase shift filter can be an all-pass filter and coupled between said input of said sub-channel signal processing section and said VPD filter.

Finally, in a still further preferred embodiment of the present invention, the main channel signal processing section comprises a delay means for delaying the main channel signal by a delay time which essentially corresponds to the processing time of said phase error compensating means so as to render both the main channel and sub-channel signals time-parallel to each other.

Figure 2:
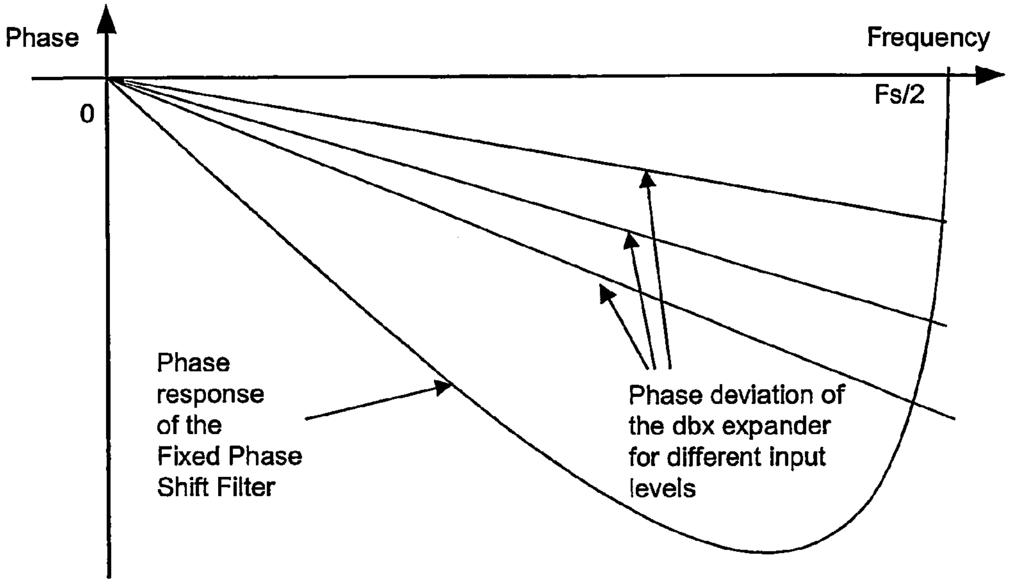
Figure 3:
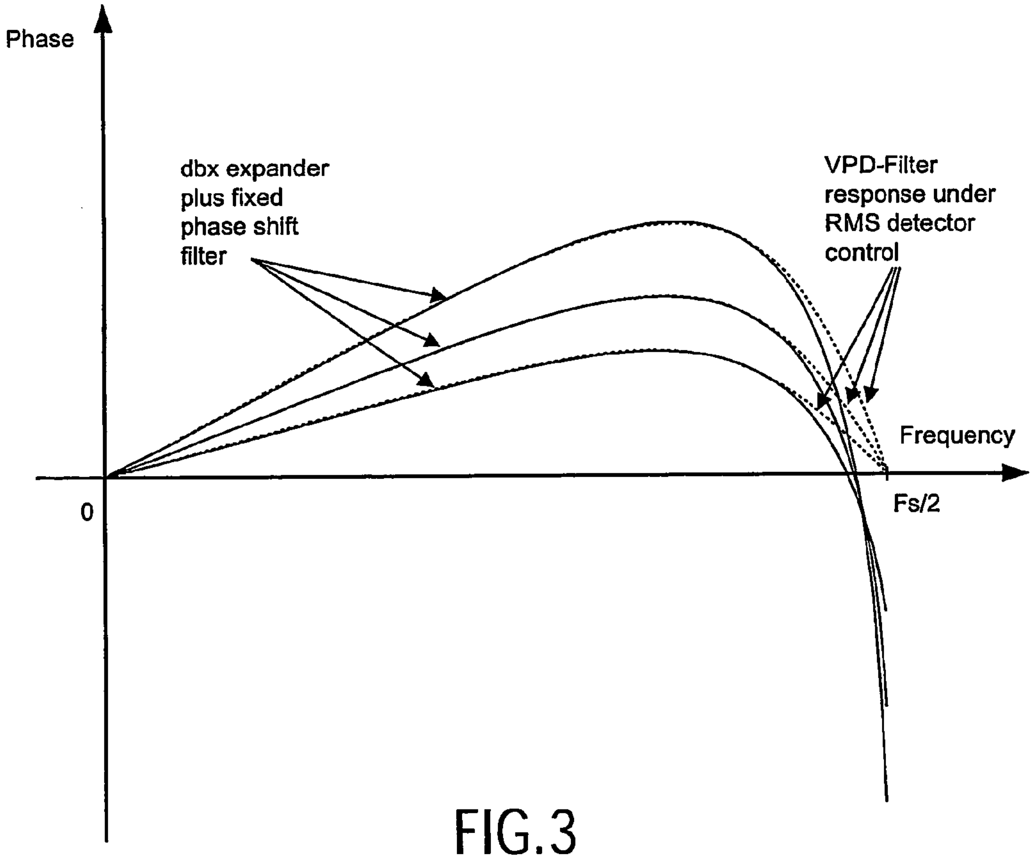

In the following, the present invention will be described in greater detail based on a preferred embodiment with reference to the accompanying drawings in which FIG. 1 shows a block diagram of a preferred embodiment of a stereo signal processing system;

FIG. 2 a graph showing the phase deviation of the DBX expander for different input levels and the phase response of the fixed phase shift filter; and FIG. 3 a graph showing the overlay of the phase deviation of the DBX expander and the fixed phase shift filter response in solid lines and the phase response of the VPD filter in dotted lines.

An implementation of the stereo signal processing system is shown as block diagram in FIG. 1. The System includes a main channel processing section and a sub-channel processing section. The sub-channel processing section includes a DBX expander with fixed de-emphasis, amplitude and spectral expander. Such DBX expander is a conventional DBX expander known from the prior art. The system shown in FIG. 1 is mainly used for a digital BTSC television decoder.

As further shown in FIG. 1, the sub-channel processing section additionally comprises an adaptive phase compensation circuit which is coupled between the sub-channel input and the DBX expander.

Namely, a problem of a digital DBX implementation is the linear level depending phase error of the variable de-emphasis filter. To overcome this, a linear level depending phase error correction is needed. For this issue a VPD (variable phase delay) filter is provided in the adaptive phase compensation circuit since such a VPD filter has a theoretical linear phase response up to half of the scanning frequency (Fs/2). To implement the level dependency the control input of the VPD filter is connected to a route main square (RMS) control output of the spectral expander. This results in very good phase error compensation, but therefore a VPD filter with a very high order is needed.

With an economic VPD filter it is possible to compensate the phase error up to FS/4. Afterwards the phase response of the VPD filter is loosing linearity and turns smoothly to zero. To overcome this without increasing the filter order of the VPD filter, a second fixed phase shift filter is provided in the adaptive phase compensation circuit and coupled between the sub-channel input and the VPD filter to format the phase error in a way that it fits mostly to the phase response of the used VPD filter. FIG. 2 shows the linear phase error of the DBX expander and the phase response of the fixed phase shift filter.

In FIG. 3, it is shown the overlay of the phase deviation of the DBX expander and the fixed phase shift filter response (solid line) together with the phase response of the VDP filter (dotted line) by instance of three input levels. It can be seen that the sum of the phase response of the DBX expander plus the phase response of the fixed phase shift filter almost fits to the phase response of the VDP filter up to Fs/2. Therefore it is possible to compensate the DBX expander phase error with an economic VPD filter by creating a difference between the sum of the phase response of the DBX expander plus the phase response of the fixed phase shift filter and the phase response of the VPD filter so as to obtain a phase error of about zero up to almost Fs/2.

As further shown in FIG. 1, the main channel processing section includes in addition to a fixed de-emphasis circuit a delay circuit for group delay compensation. This additional group delay compensation circuit which is coupled between the main channel input and the fixed de-emphasis circuit is used to compensate the additional group delay caused by the above described phase compensation in the sub-channel processing section.

Although the invention is described above with reference to an example shown in the attached drawings, it is apparent that the invention is not restricted to it, but can vary in many ways within the scope disclosed in the attached claims.

The invention claimed is:

1. A stereo sub-channel signal processor circuit comprising: an input circuit configured to receive a multichannel digital television signal including a main channel and a sub-channel of the digital television signal; a DBX expander circuit configured to expand and output an expanded sub-channel signal of the digital television signal to provide an audio signal; and a phase error compensator circuit connected between the input circuit and the DBX expander circuit and configured to process the received sub-channel of the digital television signal to compensate for a phase error in the DBX expander circuit and to set the phase of the expanded sub channel output signal to a phase that is about constant over a predetermined frequency range, wherein the phase error compensator circuit is configured to process the received sub-channel of the digital television signal to compensate for a phase error in the DBX expander circuit by variably modifying the phase of the received sub-channel signal, based upon an amplitude of the received sub-channel signal, to generate and output a modified sub-channel signal to the DBX expander circuit to set the phase of the expanded sub-channel output signal; and wherein the phase error compensator circuit includes a variable phase delay filter that processes the received sub-channel of the digital television signal to compensate for phase error up to about one-fourth of a scanning frequency for the digital television signal, and coupled between the input circuit and the variable phase delay filter, a fixed phase shift filter to format a phase error portion of the received sub-channel of the digital television signal to a phase response of the variable phase delay filter, to facilitate compensation by the variable phase delay filter at frequencies of up to about half of a scanning frequency for the digital television signal.

2. The processor circuit according to claim 1, characterized in that said phase error compensating circuit includes a linear level depending phase error correction means having a variable phase delay filter with an extended mixer functionality.

* * * * *